United States Patent
Okumoto et al.

(10) Patent No.: US 9,048,206 B2
(45) Date of Patent: Jun. 2, 2015

(54) ORGANIC ELECTROLUMINESCENCE DISPLAY PANEL AND METHOD OF MANUFACTURING THEREOF

(75) Inventors: Kenji Okumoto, Osaka (JP); Masaomi Shibata, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/131,833

(22) PCT Filed: Feb. 8, 2012

(86) PCT No.: PCT/JP2012/000833
§ 371 (c)(1),
(2), (4) Date: Jan. 9, 2014

(87) PCT Pub. No.: WO2013/011599
PCT Pub. Date: Jan. 24, 2013

(65) Prior Publication Data
US 2014/0167018 A1    Jun. 19, 2014

(30) Foreign Application Priority Data
Jul. 20, 2011    (JP) .................................. 2011-159054

(51) Int. Cl.
*H01J 1/62*    (2006.01)
*H01L 27/32*   (2006.01)
*H01L 51/56*   (2006.01)
(Continued)

(52) U.S. Cl.
CPC ............ *H01L 27/3244* (2013.01); *H01L 51/56* (2013.01); *H01L 51/5008* (2013.01); *H01L 51/5012* (2013.01); *H01L 51/5228* (2013.01); *H01L 51/5278* (2013.01);
(Continued)

(58) Field of Classification Search
USPC ..................................... 313/504, 506; 257/79
See application file for complete search history.

(56) References Cited

U.S. PATENT DOCUMENTS 5,443,922 A    8/1995    Nishizaki et al.
6,114,183 A    9/2000    Hamada et al.
(Continued)

FOREIGN PATENT DOCUMENTS

JP    5-163488    6/1993
JP    10-172762   6/1998
(Continued)

OTHER PUBLICATIONS

International Search Report (ISR) in International Patent Application No. PCT/JP2012/000833, dated Apr. 24, 2012.

*Primary Examiner* — David Vu
*Assistant Examiner* — Brandon Fox
(74) *Attorney, Agent, or Firm* — Greenblum & Bernstein, P.L.C.

(57) ABSTRACT

An organic EL display panel has a transistor array substrate, an inter-layer insulation film, pixel electrodes, an organic EL layer, and a common electrode. The transistor array substrate has drive units, including TFT elements. The inter-layer insulation film covers the transistor array substrate, and has contact holes corresponding to the drive units. The pixel electrodes on the inter-layer insulation film correspond to the drive units, and are electrically connected thereto via the contact holes. The organic EL layer covers regions where the pixel electrodes are and are not disposed. The common electrode covers the entire organic EL layer. Organic EL layer regions corresponding to the contact holes of the inter-layer insulation film and between neighboring pixel electrodes have greater electrical resistance than other regions.

17 Claims, 12 Drawing Sheets

(51) Int. Cl.
*H01L 51/50* (2006.01)
*H01L 51/52* (2006.01)

(52) U.S. Cl.
CPC .......... *H01L 51/5284* (2013.01); *H01L 27/322* (2013.01); *H01L 2227/323* (2013.01)

(56) References Cited

U.S. PATENT DOCUMENTS

| | | | |
|---|---|---|---|
| 6,642,544 | B1 | 11/2003 | Hamada et al. |
| 7,511,421 | B2 * | 3/2009 | Tsutsui et al. ............... 313/506 |
| 8,093,603 | B2 * | 1/2012 | Jung et al. .................. 257/88 |
| 2001/0011868 | A1 * | 8/2001 | Fukunaga et al. ........... 313/506 |
| 2002/0003402 | A1 | 1/2002 | Yamaguchi et al. |
| 2004/0077250 | A1 * | 4/2004 | Miyadera et al. ............... 445/24 |
| 2006/0244368 | A1 | 11/2006 | Nagayama et al. |
| 2007/0108440 | A1 | 5/2007 | Kubota |
| 2007/0108899 | A1 * | 5/2007 | Jung et al. .................... 313/506 |
| 2010/0102343 | A1 | 4/2010 | Ono et al. |
| 2010/0194272 | A1 * | 8/2010 | Kubota ........................ 315/32 |
| 2013/0328024 | A1 | 12/2013 | Mizusaki et al. |

FOREIGN PATENT DOCUMENTS

| | | | |
|---|---|---|---|
| JP | 2002-025781 | | 1/2002 |
| JP | 2004-127794 | | 4/2004 |
| JP | 2006-261058 | | 9/2006 |
| JP | 2007-156387 | | 6/2007 |
| JP | 2007-214234 | | 8/2007 |
| JP | 2009-176700 | | 8/2009 |
| JP | 2009176700 A | * | 8/2009 |
| JP | 2010-073327 | | 4/2010 |
| JP | 2010-146919 | | 7/2010 |
| JP | 4584836 | | 11/2010 |
| JP | 2011-096406 | | 5/2011 |
| WO | 2005/004550 | | 1/2005 |
| WO | 2008/105153 | | 9/2008 |

* cited by examiner

ORGANIC ELECTROLUMINESCENCE DISPLAY PANEL AND METHOD OF MANUFACTURING THEREOF

TECHNICAL FIELD

The present invention pertains to an organic electroluminescence display panel using a common organic electroluminescence material for all pixels, and to a manufacturing method thereof

BACKGROUND ART

An organic electroluminescence display panel has three colours of pixels, e.g., red, green, and blue, and performs adjustments to the luminance of light emitted by each pixel to produce a variety of other colours. Pixel colour division is performed according to two types, a first type in which organic electroluminescence material for red, green, and blue pixels is used separately, and a second type in which a common organic electroluminescence material producing white light is used for all pixels while a colour filter is provided to form the red, green, and blue pixels. However, at present, many difficulties are involved in obtaining organic electroluminescence materials for achieving pure red, green, and blue colours. As such, a colour filter is typically provided even when the first type is being used. The colour filter is thus commonly used for both types of panels. Thus, the second type has manufacturing merits in that the pixels need not be separated during organic electroluminescence layer formation. Patent Literature 1 describes an example of the second type of panel, proposing a simple matrix display type of organic electroluminescence display panel with a simplified construction process.

CITATION LIST

Patent Literature

[Patent Literature 1]
Japanese Patent No. 4584836

SUMMARY OF INVENTION

Technical Problem

In one aspect, the present disclosure aims to provide an organic electroluminescence display panel of the simple matrix display type in which pixel defects are constrained, while enabling simpler manufacturing.

Solution to Problem

An organic electroluminescence display panel pertaining to an aspect of the disclosure has: a transistor array substrate on which are disposed a plurality of drive units each including a thin-film transistor element; an inter-layer insulation film formed over the transistor array substrate, and having a plurality of contact holes each formed in part of respective regions of the inter-layer insulation film corresponding to the drive units; a plurality of pixel electrodes disposed on the inter-layer insulation film in correspondence with the drive units, and electrically connected to the drive units via the contact holes; an organic electroluminescence layer formed to entirely cover portions of the inter-layer insulation film where the pixel electrodes are disposed and where the pixel electrodes are not disposed; and a common electrode formed across the entirety of the organic electroluminescence layer. Regions of the organic electroluminescence layer corresponding to the contact holes in the inter-layer insulation film and to an area between neighbouring pixel electrodes have higher electrical resistance than another region of the organic electroluminescence layer.

Advantageous Effects of Invention

The organic electroluminescence display panel pertaining to an aspect of the disclosure includes regions of the organic electroluminescence layer corresponding to the contact holes and to inter-pixel regions having a higher electrical resistance than other regions of the organic electroluminescence layer.

The regions of the organic electroluminescence layer corresponding to the contact holes have higher electrical resistance than other regions of the organic electroluminescence layer. Thus, although the regions corresponding to the contact holes may be thinner than other regions, the current flowing through these thin-film portions is constrained. Accordingly, the pixel defects occurring in the thin portions is made constrainable.

DESCRIPTION OF EMBODIMENT

Embodiment

Figure 1:
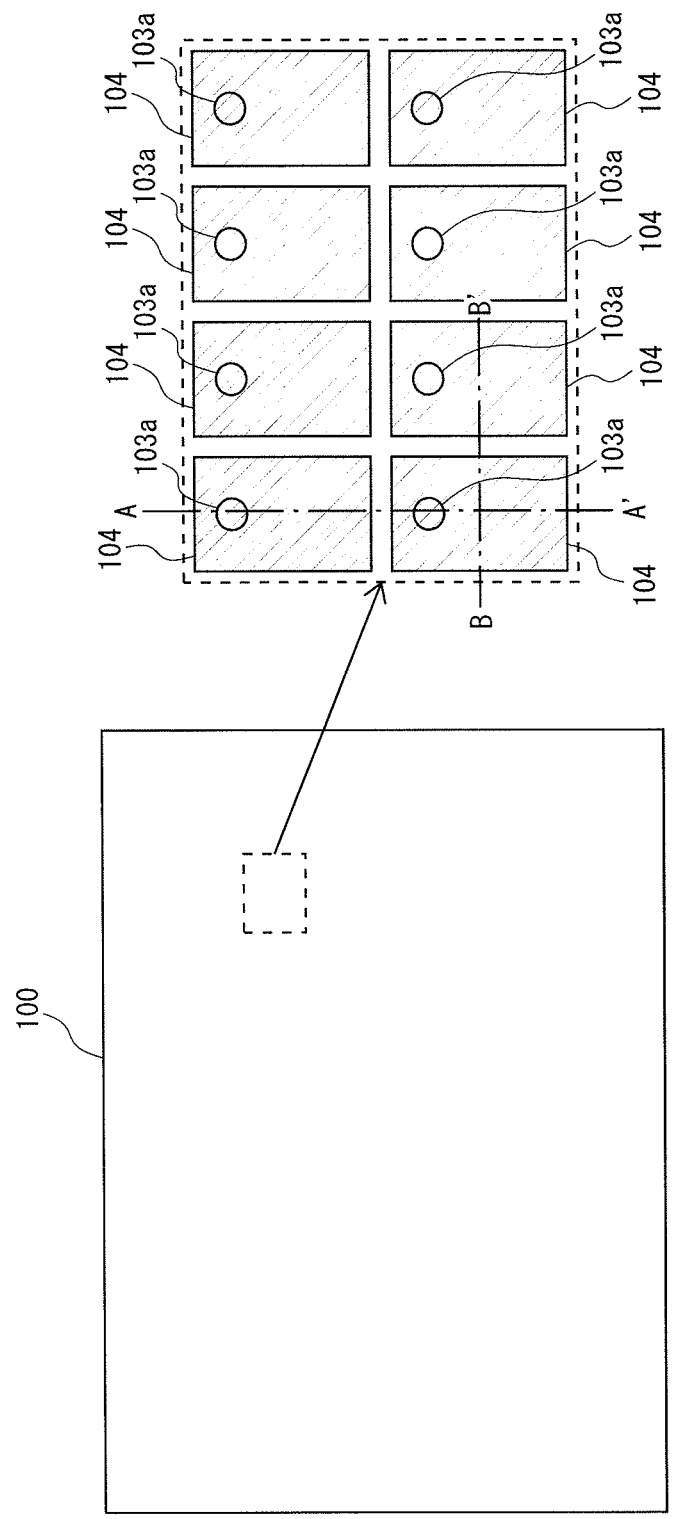
FIG. 1 is a schematic diagram illustrating the relationship between pixel electrodes 104 and contact holes 103a in an organic electroluminescence display panel 100 pertaining to the Embodiment.

In one aspect, an organic electroluminescence display panel comprises: a transistor array substrate on which are disposed a plurality of drive units each including a thin-film transistor element; an inter-layer insulation film formed over the transistor array substrate, and having a plurality of contact holes each formed in part of respective regions of the inter-layer insulation film corresponding to the drive units; a plurality of pixel electrodes disposed on the inter-layer insulation film in correspondence with the drive units, and electrically connected to the drive units via the contact holes; an organic electroluminescence layer formed to entirely cover portions of the inter-layer insulation film where the pixel electrodes are disposed and where the pixel electrodes are not disposed; and a common electrode formed across the entirety of the organic electroluminescence layer, wherein regions of the organic electroluminescence layer corresponding to the contact holes in the inter-layer insulation film and to an area between neighbouring pixel electrodes have higher electrical resistance than another region of the organic electroluminescence layer.

The organic electroluminescence display panel (hereinafter, organic EL display panel) pertaining to this aspect of the disclosure includes regions of the organic electroluminescence layer (hereinafter, organic EL layer) corresponding to the contact holes and to inter-pixel regions having a higher electrical resistance than other regions of the organic electroluminescence layer.

The regions of the organic EL layer corresponding to the contact holes have higher electrical resistance than other regions of the organic EL layer. Although the regions corresponding to the contact holes may be thinner than other regions, the current flowing through the thin-film portions is constrainable. Thus, the pixel defects occurring in the thin portions are made constrainable.

Also, inter-pixel light emission is constrained by the regions of the organic EL layer corresponding to the contact holes and to inter-pixel regions having higher electrical resistance than other regions of the organic EL layer.

In another aspect, the organic electroluminescence layer includes a first organic light-emitting layer and a second organic-light emitting layer arranged at separation from the first organic light-emitting layer with respect to a layering direction, a charge generation layer is located in the other region of the organic electroluminescence layer, and includes two or more sub-layers between the first organic light-emitting layer and the second organic light-emitting layer, and a mixed layer in which is combined material from each of the two or more sub-layers between the first organic light-emitting layer and the second organic light-emitting layer is located in the regions corresponding to the contact holes in the inter-layer insulation film and to the area between the neighbouring pixel electrodes.

According to this organic EL display panel, the mixed layer is present between the first organic light-emitting layer and the second organic light-emitting layer in regions of the organic EL layer corresponding to the contact holes and to the inter-pixel regions. The mixed layer combines material from the layers making up the charge generation layer and as such, does not function as a charge generation layer but rather as an insulation layer. Thus, the flow of current through the organic EL layer is diminished in the regions corresponding to the contact holes and to the inter-pixel regions.

In a further aspect, a metal layer is formed over the common electrode, in the regions corresponding to the contact holes in the inter-layer insulation film and to the area between the neighbouring pixel electrodes.

Here, as an alternate aspect, the metal layer may have a reflective index of no more than 30%, with respect to visible light incident on the top face thereof.

According to this organic EL display panel, the top face of the metal layer has a reflective index of no more than 30% with respect to visible light. As such, the metal layer functions as a black matrix. Thus, light escaping from the regions of the organic EL layer corresponding to the contact holes and to the inter-pixel regions is blocked. In addition, the metal layer absorbs outside light, thus improving photo-contrast.

Also, as another alternate aspect, the metal layer is an auxiliary electrode, and is electrically connected to the common electrode.

According to this organic EL display panel, the metal layer serves as an auxiliary electrode and is electrically connected to the common electrode. As such, the metal layer functions as a power supply for the common electrode. Accordingly, the effect of voltage decreasing at the centre of the panel is diminished.

Also, the organic electroluminescence layer includes an organic light-emitting layer producing white light.

Additionally, a colour filter corresponding to each of the pixel electrodes is formed over the common electrode.

Furthermore, the pixel electrodes are formed of an optically reflective material, and the common electrode is formed of an optically transmissive material.

In one aspect of the disclosure, an organic electroluminescence display panel manufacturing method comprises: preparing a substrate; forming a transistor array substrate by disposing a plurality of drive units each including a thin-film transistor element, on the substrate; forming an inter-layer insulation film having a plurality of contact holes each formed in part of respective regions corresponding to the drive units, over the transistor array substrate; disposing a plurality of pixel electrodes on the inter-layer insulation film in correspondence with the drive units, the pixel electrodes being electrically connected to the drive units via the contact holes; forming an organic electroluminescence layer to entirely cover portions where the pixel electrodes are disposed and where the pixel electrodes are not disposed; and forming a common electrode across the entirety of the organic electroluminescence layer, wherein regions of the organic electroluminescence layer corresponding to the contact holes in the inter-layer insulation film and to an area between neighbouring pixel electrodes have higher electrical resistance than another region of the organic electroluminescence layer.

In another aspect, forming an intermediate layer over the common electrode in order to protect the common electrode; forming an optical barrier layer on a region of the intermediate layer excluding the regions corresponding to the contact holes in the inter-layer insulation film and to the area between neighbouring pixel electrodes; and irradiating the organic electroluminescence layer with a predetermined laser light from above the optical barrier layer, such that the optical barrier layer serves as a resist, wherein the regions of the organic electroluminescence layer corresponding to the contact holes in the inter-layer insulation film and to the area between neighbouring pixel electrodes have higher electrical resistance than the other region of the organic electroluminescence layer due to degradation upon irradiation with the laser light.

According to the manufacturing method of the organic EL display panel of this aspect, the regions of the organic EL layer corresponding to the contact holes of the inter-layer insulation film and to the regions between neighbouring pixel electrodes are degraded by exposure to the laser light, and thus have greater electrical resistance than other regions. Accordingly, the pixel defects, in the presence of the thin-film portion of the organic EL layer, are constrainable through a simple process.

Also, the predetermined laser light has a wavelength of no more than 420 nm.

Additionally, the predetermined laser light includes ultraviolet light.

Further, the optical barrier layer absorbs light having a wavelength of 420 nm or less, while allowing light from the organic electroluminescence layer to pass therethrough.

In yet another aspect, exposing the regions of the common electrode corresponding to the contact holes in the inter-layer insulation film and to the area between neighbouring pixel electrodes after forming the optical barrier layer and before irradiation with the laser light, by removing a portion of the intermediate layer with the optical barrier layer serving as the resist, and forming a metal layer over the exposed regions of the common electrode.

According to this manufacturing method for the organic EL display panel, the optical barrier layer is used twice, namely in the removal process of removing a portion of the intermediate layer and in the laser irradiation process. As such, this approach constrains the increase in processes.

Here, as an alternate aspect, the metal layer may have a reflective index of no more than 30%, with respect to visible light incident on the top face thereof.

Also, as another alternate aspect, the metal layer is an auxiliary electrode, and is electrically connected to the common electrode.

In a further alternate aspect, the organic electroluminescence layer is formed by layering a first organic light-emitting layer, a charge generation layer that includes two or more sub-layers, and a second organic light-emitting layer, in the stated order, and regions of the charge generation layer corresponding to the contact holes in the inter-layer insulation film and to the area between neighbouring pixel electrodes have higher electrical resistance than another region of the charge generation layer due to the irradiation with the laser light.

Furthermore, the pixel electrodes are formed of an optically reflective material, and the common electrode is formed of an optically transmissive material.

According to this manufacturing method for the organic EL display panel, the regions of the organic EL layer corresponding to the contact holes and to the inter-pixel regions have effectively enhanced electrical resistance due to the laser light passing through the common electrode and the laser light reflected by the pixel electrodes.

(Circumstances Leading to Invention)

Prior to the explanation of the Embodiment, the circumstances and history of the solution to the problem used in the Embodiment are described in detail.

Patent Literature 1 describes an example of the second type of panel, proposing a simple matrix display type of organic EL display panel with a simplified construction process.

Figure 12:
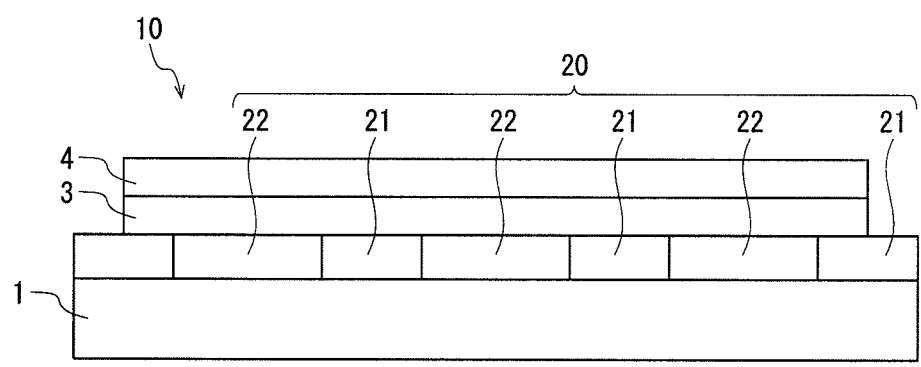
FIG. 12 is a schematic partial cross-section of an organic electroluminescence display panel 10.

FIG. 12 is a schematic partial cross-section of an organic EL display panel 10 pertaining to Patent Literature 1. As shown, the organic EL display panel 10 includes a substrate 1, a common layer 20, an organic EL layer 3, and an electrode layer 4. The common layer 20 is made up of low-resistance portions 21, formed from a metal in correspondence to the pixels, and a high-resistance portion 22, formed from a metal oxide material in corresponds to inter-pixel areas. The low-resistance portions 21 function as pixel electrodes when different voltage is applied to each pixel. The common layer 20 is formed by first forming a metal layer over the substrate 1 and then applying an oxidation process to a lattice-shaped portion of the metal layer in correspondence with the pixels. As such, the pixel electrodes are formed in the oxidation process only, without requiring an etching process or the like. This simplified process is also used for patterning the common layer 20. As a result, the organic EL display panel is produced.

As it happens, in recent years, research has prospered in the field of active matrix type organic EL display panels, which surpass simple matrix type panels in terms of response speed, contrast, and so on. Such organic EL display panels have a plurality of drive units each including a thin-film transistor (hereinafter also TFT) element disposed on a substrate, and an inter-layer insulation film formed so as to cover the drive units. The inter-layer insulation film has contact holes each formed in a portion of a region corresponding to one of the drive units. A plurality of pixel electrodes are formed on the inter-layer insulation film in correspondence with the drive units so as to be partially inserted within the corresponding contact holes. Accordingly, the pixel electrodes are electrically connected to the corresponding drive units.

In terms of simplifying the manufacturing process for the organic EL layer, forming the organic EL layer in a unified process is also beneficial for the active matrix display type of organic EL display panel.

However, applying the configuration described in Patent Literature 1 to an active matrix type organic EL display panel results in the low-resistance portions of the common layer being partially inserted in the contact holes. Similarly, these portions are also formed alongside the contact hole in a portion of the organic EL layer. Thus, there is a risk that portions of the organic EL layer with less thickness than other planar regions of the organic EL layer (hereinafter, thin-film portions) are formed in the regions corresponding to the contact holes, as well as portions of greater thickness. Specifically, when thin-film portions are formed, the electric field is prone to concentration in these thin-film portion, thus producing greater current flow than current flow in other planar regions. Thus, an organic EL layer having thin-film portions experiences earlier pixel defects and has a reduced useful life-span in comparison to an organic EL layer that does not have thin-film portions.

As such, the Embodiment of the disclosure aims to provide an organic EL display panel in which pixel defects are constrained.

The Embodiment of the disclosure has been achieved in consideration of the above-described problem.

Embodiment 1

—Overall Configuration of Organic EL Display Panel—

The organic EL display panel pertaining to the present Embodiment is an active matrix display-type organic electroluminescence display panel. This panel has a thin-film transistor layer formed over a substrate, and has an inter-layer insulation film formed over the TFT layer. The TFT layer has a plurality of drive units disposed therein, including TFT elements. For instance, each of the drive units may be configured to include a switching transistor and a drive transistor. The inter-layer insulation film has contact holes each formed in a portion of a region corresponding to one of the drive units. A plurality of pixel electrodes are formed on the inter-layer insulation film in one-to-one correspondence with the drive units. Each of the pixel electrodes has a portion electrically connected to a corresponding drive unit by being partially located within the corresponding contact hole. In addition, an organic EL layer is formed over the entirety of the region where the pixel electrodes are disposed and the regions where no pixels are arranged, and a common electrode is further formed over the entirety of the organic EL layer. Here, the regions of the organic EL layer corresponding to the contact holes and to inter-pixel regions have a higher electrical resistance than other regions of the organic EL layer. Thus, although the regions corresponding to the contact holes may be relatively thin in comparison to other regions, the current passing through these thin portions is nevertheless constrained. Accordingly, the pixel defects occurring in the thin portions is made constrainable. Also, inter-pixel light emission is constrained by the regions of organic EL layer corresponding to the contact holes and to inter-pixel regions having higher electrical resistance than other regions of the organic EL layer.

—Cross-Section of Organic EL Display Panel—

FIG. 1 is a schematic diagram illustrating the positional relationship between pixel electrodes 104 and contact holes 103a in an organic EL display panel 100 pertaining to the present Embodiment.

Figure 2:
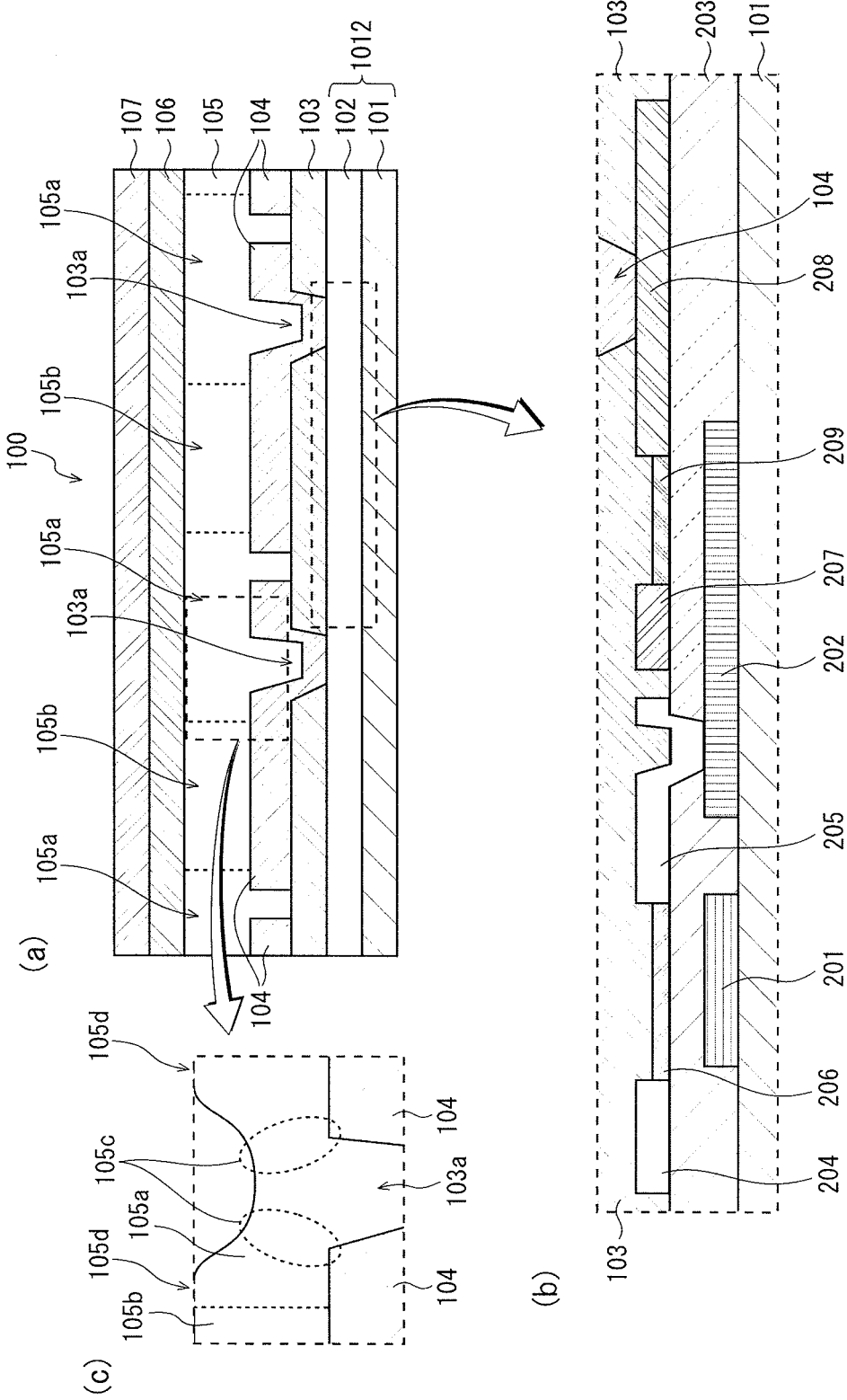
FIG. 2 is a schematic diagram of the organic electroluminescence display panel where portion (a) is a cross-sectional view (taken along line A-A' of FIG. 1), portion (b) is a partial cross section of a TFT layer 102, and portion (c) depicts a portion corresponding to contact holes 103a of an organic electroluminescence layer 105.

Portion (a) of FIG. 2 is a schematic partial cross-section (taken along line A-A' of FIG. 1) of the organic EL display panel 100. The organic EL display panel 100 includes a substrate 101, a TFT layer 102, an inter-layer insulation film 103, a plurality of pixel electrodes 104, an organic EL layer 105, a common electrode 106, and an intermediate layer 107. The detailed configuration of the organic EL display panel 100 is described below. The TFT layer 102 is formed over the substrate 101 (hereinafter, the TFT layer 102 formed over the substrate 101 is also referred to in combination as a transistor array substrate 1012). The TFT layer 102 has a plurality of drive units disposed therein, including TFT elements. The TFT layer 102 is described in detail below, with reference to portion (b) of FIG. 2. Portion (b) of FIG. 2 is a schematic partial cross section of the TFT layer 102. First, a switching transistor gate electrode 201 and a drive transistor gate electrode 202 are formed on the substrate 101 with some separation therebetween. A gate insulation film 203 is formed so as to cover the gate electrodes 201 and 202. A semiconductor layer 206 is provided over the gate insulation film 203 in a portion corresponding to the top of the switching transistor gate electrode 201. A pair of source and drain electrodes (hereinafter, SD electrodes) 204 and 205 are formed on opposite sides of semiconductor layer 206, each being in contact with the semiconductor layer 206. A portion of the gate insulation film 203 corresponding to the drive transistor gate electrode 202 is provided with one of the contact holes and a portion of SD electrode 205 is inserted in that contact hole, thus establishing contact with the drive transistor gate electrode 202. Another semiconductor layer 209 is provided over the gate insulation film 203 in a portion corresponding to the top of the switching transistor gate electrode 202. A pair of SD electrodes 207 and 208 are formed on opposite sides of the semiconductor layer 209, each being in contact with semiconductor layer 209.

The explanation now returns to portion (a) of FIG. 2. As shown, the inter-layer insulation film 103 is formed over the TFT layer 102. The contact holes 103a are formed in a portion of the inter-layer insulation film 103 corresponding to the area where SD electrode 208 is arranged. The pixel electrodes 104 are formed on the inter-layer insulation film 103 in correspondence with the contact holes 103a. Each pixel electrode 104 is partially located within the corresponding contact hole 103a, and is thereby electrically connected to the corresponding SD electrode 208. The organic EL layer 105 is formed so as to cover the pixel electrodes 104 and all areas of the inter-layer insulation film 103 where the pixel electrodes 104 are not formed. The common electrode 106 is formed over the entirety of the organic EL layer 105 and the intermediate layer 107 is formed over the common electrode 106.

Portion (a) of FIG. 2 shows the top face of the organic EL layer 105 as being flat. However, in reality, surface irregularities are present in the area of the contact holes 103a. The portions of the organic EL layer 105 corresponding to the contact holes 103a are shaped as shown in portion (c) of FIG. 2. A thin-film portion 105c corresponding to an edge of a given contact hole 103a is thinner than a planar portion 105d.

The organic EL layer 105 also includes a non-light-emitting region 105a. The non-light-emitting region 105a is treated through exposure to ultraviolet light or the like, so as to increase the electrical resistance of this region relative to other regions of the organic EL layer 105. Specifically, the non-light-emitting region 105a includes sub-regions corresponding to the contact holes 103a of the inter-layer insulation film 103 (i.e., including the thin-film portions 105c) and sub-regions between neighbouring pixel electrodes 104. Regions of the organic EL layer 105 other than the non-light-emitting region 105a are partitioned into pixel units by the non-light-emitting region 105a and thus function as light-emitting regions 105b that are individually partitioned.

Within the organic EL layer 105, the non-light-emitting region 105a has higher electrical resistance than the light-emitting region 105b. As such, current flow is constrainable in the non-light-emitting region 105a in contrast to the light-emitting region 105b. As such, the current flowing in the thin-film portions 105c is constrainable. Accordingly, pixel defects originating in the thin-film portions 105c are constrained.

Given that the current flowing through the inter-pixel regions of the organic EL layer 105 is also constrainable, light emission between the pixels is constrained to create the non-light-emitting region 105a.

Figure 3:
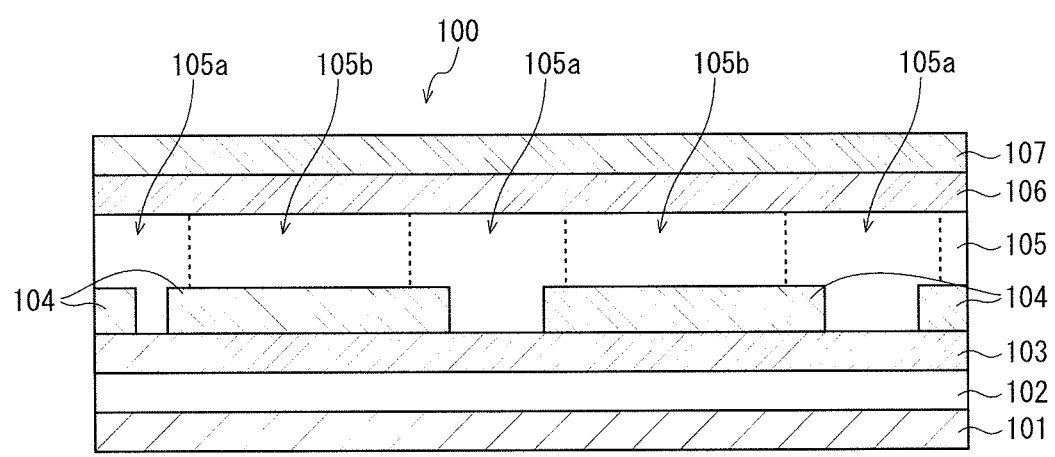
FIG. 3 is a schematic partial cross-section (taken along line B-B' of FIG. 1) of the organic electroluminescence display panel 100.

FIG. 3 is a schematic partial cross-section (taken along line B-B' of FIG. 1) of the organic EL display panel 100. As shown, the TFT layer 102 is formed over the substrate 101 and the inter-layer insulation film 103 is formed over the TFT layer 102. The pixel electrodes 104 are formed over the inter-layer insulation film 103 and the organic EL layer 105 is formed so as to cover the pixel electrodes 104 as well as all areas of the inter-layer insulation film 103 where the pixel electrodes 104 are not formed. As described above, the organic EL layer 105 has a non-light-emitting region 105a formed so as to correspond to regions between neighbouring pixel electrodes 104. Accordingly, each pixel is made to produce light of a desired luminance with very little influence on neighbouring pixels. The common electrode 106 is formed over the entirety of the organic electroluminescence layer 105 and the intermediate layer 107 is formed over the common electrode 106.

Although not shown in FIGS. 2 and 3, a sealing layer may be formed, for example, on the intermediate layer 107, and a colour filter may be provided over the sealing layer for each pixel electrode 104.

—Organic EL Display Panel 100 Layer Materials—

The materials used in each layer of the organic EL display panel 100 are described in detail below.

—Substrate 101—

The substrate 101 is made of an insulating material such as a non-alkali glass, a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, aluminium oxide, and so on. The substrate 101 may also be made of an organic resin film.

—TFT Layer 102—

The TFT layer 102 is formed over the substrate 101 by forming the TFT, wiring, and a passivation layer that covers the TFT. The TFT is prepared using silicon, a semiconductor oxide such as indium-gallium-zinc oxide, an organic semiconductor such as a pentacene, or the like as the channel material.

Inter-Layer Insulation Film 103—

The inter-layer insulation film 103 is formed from an insulating material such as a polyimide resin or an acrylic resin.

—Pixel Electrodes 104—

No particular limitation is intended regarding the material of the pixel electrodes 104. However, an optically reflective material is beneficial. Applicable materials include metals, conductive oxides, and conductive polymers. Examples of applicable metals include aluminium, a silver alloy, molybdenum, tungsten, titanium, chromium, nickel, zinc, or an alloy of any of the above. Examples of applicable conductive oxides include indium-tin oxide, indium-zinc oxide, and zinc oxide. Applicable conductive polymers include polyaniline, polythiophene, or a combination thereof with an acid or a base substance.

—Organic EL Layer 105—

The organic EL layer 105 is formed so as to at least include an organic light-emitting layer producing white light. For instance, a hole injection layer, a hole transport layer, the organic light-emitting layer, and an electron injection layer may be layered in the stated order. The organic light-emitting layer is beneficially a polymer material such as polyfluorene, poly(p-phenylene vinylene), polyacetylene, polyphenylene, poly(para-phenylene ethylene), poly-3-hexyl thiophene, or a derivative of any of the above, or one of the materials cited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinoline compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on. The white light may be produced by combining two or more organic light-emitting layers. For instance, an organic light-emitting layer producing blue light and an organic light-emitting layer producing orange light may be combined to produce while light.

—Common Electrode 106—

The common electrode 106 is beneficially formed from a material that is highly optically transmissive and highly electrically conductive. Beneficial materials include indium-tin-oxide and zinc oxide. Also, electrodes may be made by combining layers of silver and magnesium with a respective thickness of no more than 20 nm, or by forming a compound of silver and magnesium.

—Intermediate Layer 107—

The intermediate layer 107 serves as a protective layer protecting the common electrode 106. The material for the intermediate layer 107 is beneficially silicon oxide or silicon nitride.

—Manufacturing Method for Organic EL Display Panel 100—

A manufacturing method for the organic EL display panel 100 is described next. FIGS. 4A-4D, 5A-5C, 6A, and 6B illustrate an example of the manufacturing method for the organic EL display panel 100. These illustrations are schematic diagrams centred on a portion of the organic EL display panel 100.

Figure 4A:
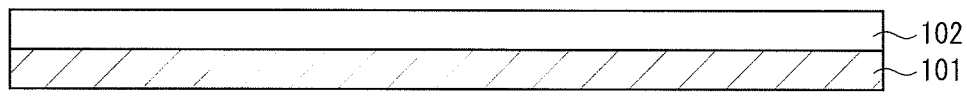
FIGS. 4A-4D illustrate an example of a manufacturing method for the organic electroluminescence display panel 100.

First, as shown in FIG. 4A the TFT layer 102 is formed over the substrate 101.

Figure 4B:
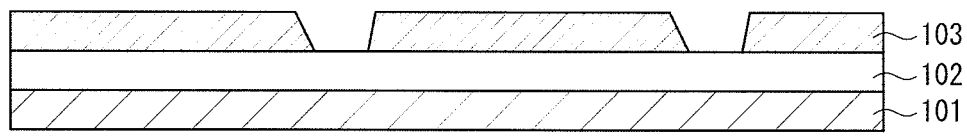

Next, a layer of positive photoresist material is, for example, formed over the insulating material layer using a spin coat method, and subject to pre-baking. The layer of photoresist material has a thickness of 2.0 μm, and is subject to pre-baking at a temperature of 100° C., for example. Afterward, a mask having apertures of a predetermined shape is superposed on the layer of photoresist material, and the top of the mask is exposed to light. After exposure, excess photoresist material is washed away with developer fluid and cleaned with pure water, then subjected to post-baking. Accordingly, the inter-layer insulation film 103 is completed, as shown in FIG. 4B. The developer fluid is, for example, a tetramethylammonium hydroxide (hereinafter, TMAH) solution. Post-baking is performed at a temperature of 200° C. for a baking time of 3 hours, for example.

Figure 4C:
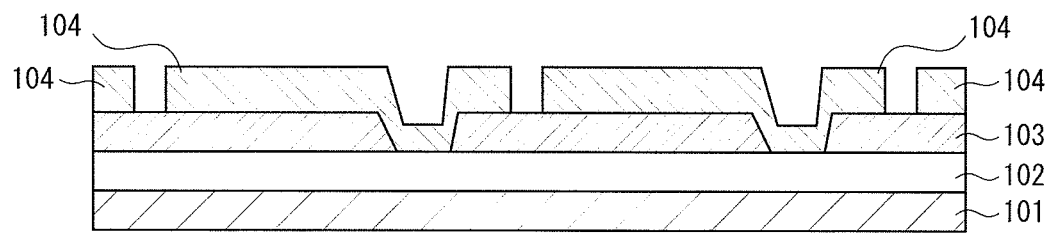

After inter-layer insulation film 103 formation, a layer of pixel electrode material is formed over the inter-layer insulation film 103 using a sputtering method. The pixel electrode material layer has a thickness of 200 nm, for example. A layer of positive resist material is formed over the layer of pixel electrode material and is subject to pre-baking. The layer of positive resist material has a thickness of 1 μm, and is subject to pre-baking at a temperature of 100° C., for example. Afterward, a mask having apertures of a predetermined shape is superposed, and the top of the mask is exposed to light, followed by developing using an alkali developing fluid. After developing, an etching fluid (e.g., a mixture including phosphoric acid, nitric acid, and acetic acid) is used to perform etching on the layer of pixel electrode material. After etching, any remaining positive resist material is removed using a peeling solution. Accordingly, the pixel electrodes 104 are completed, as shown in FIG. 4C.

Figure 4D:
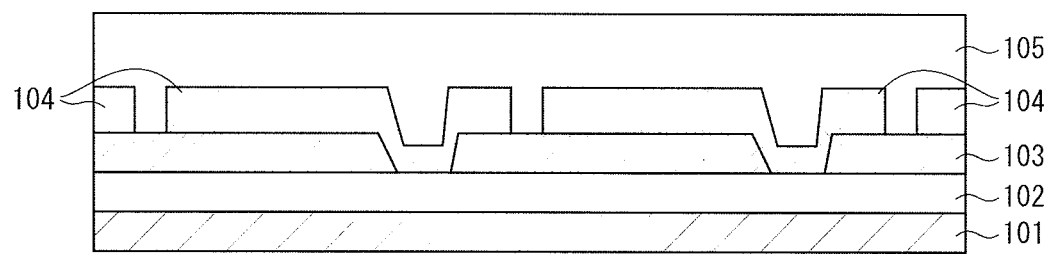

Next, as shown in FIG. 4D, the organic EL layer 105 is formed so as to entirely cover the pixel electrodes 104 and areas of the inter-layer insulation film 103 where the pixel electrodes 104 are not disposed.

Figure 5A:
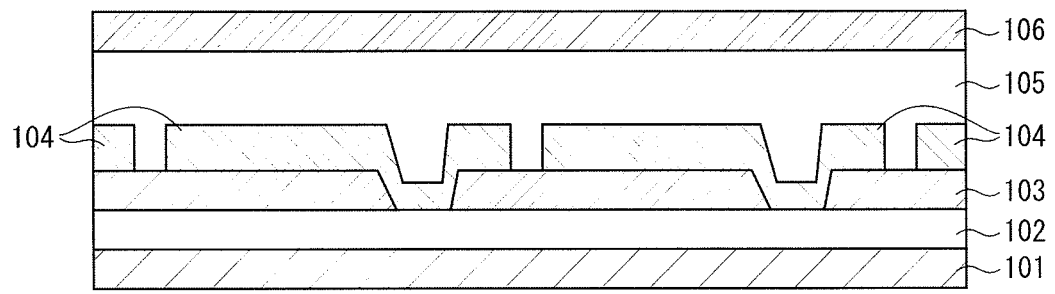
FIGS. 5A-5C further illustrate the example of the manufacturing method for the organic electroluminescence display panel 100.
Figure 5B:
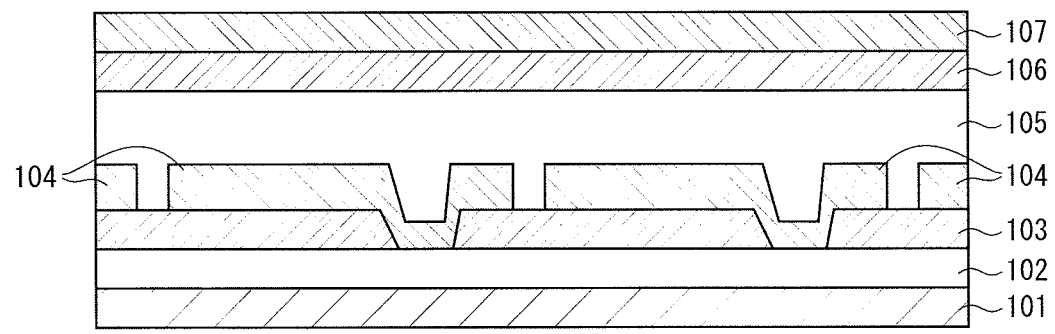

Furthermore, as shown in FIG. 5A, the common electrode 106 is formed over the entirety of the organic EL layer 105 using a sputtering method. Subsequently, as shown in FIG. 5B, the intermediate layer 107 is formed over the common electrode 106 using a chemical vacuum deposition method. The common electrode 106 has a thickness of 200 nm, and the intermediate layer 107 has a thickness of 1000 nm, for example.

Next, a layer of optical barrier material is formed on the intermediate layer 107 from a material that is superbly transmissive in the visible light band and that absorbs light (e.g., ultraviolet light) from a later-described irradiation process performed, and pre-baking is performed at 80° C., for example. The optical barrier material beneficially absorbs at least 50% of the light used in the irradiation process, and is transmissive to at least 50% of visible light. This signifies that the light used in the irradiation process beneficially has a principal wavelength that is outside the visible spectrum. For example, when ultraviolet light is used in the irradiation process, a widely-used photosensitive resist material is therefore usable. More precisely, a phenol polymer material or an acrylic polymer material is used, for example. These materials absorb ultraviolet rays while also allowing visible light to pass through with little absorption. The layer of optical barrier material has a thickness of 2.5 µm, for example.

Figure 5C:
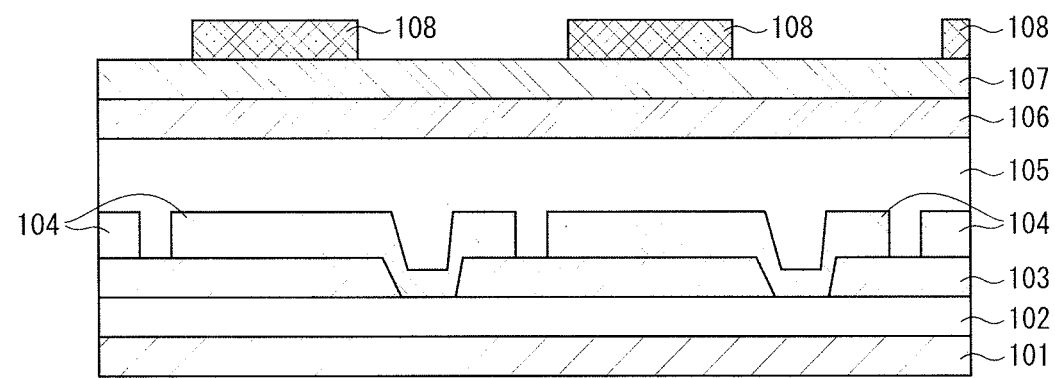

After pre-baking, a mask having apertures of a predetermined shape is superposed, and the top of the mask is exposed to light, followed by developing. The developing fluid is, for example, NMD-3 produced by Tokyo Ohka Kogyo Co. Developing is followed by washing with water, and drying at 80° C., for example. Accordingly, as shown in FIG. 5C, the optical barrier layer 108 is formed over the regions of the organic EL layer 105 corresponding to the contact holes and to inter-pixel areas.

Figure 6A:
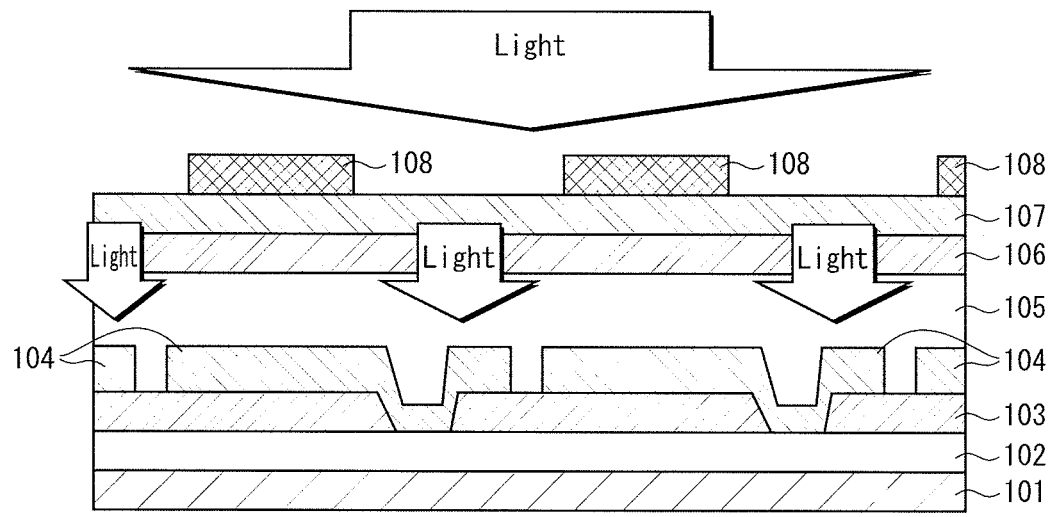
FIGS. 6A and 6B further illustrate the example of the manufacturing method for the organic electroluminescence display panel 100.
Figure 6B:
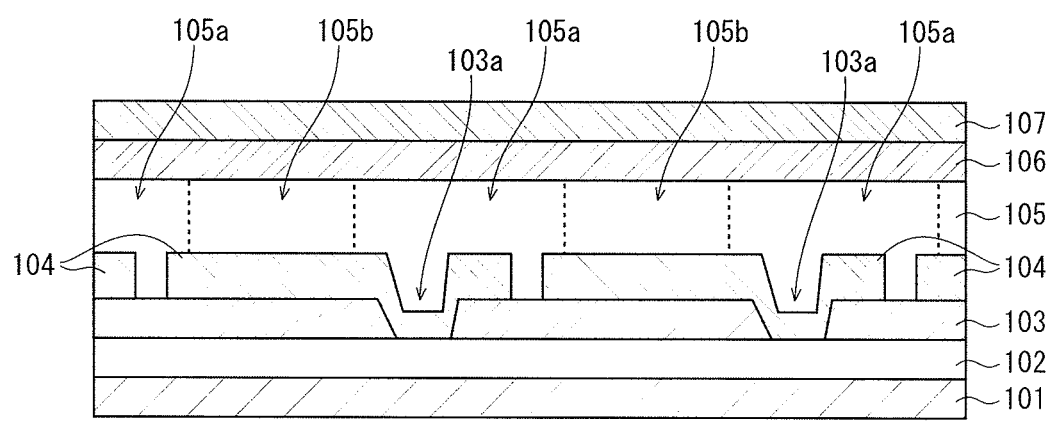

Next, as shown in FIG. 6A, irradiation is performed using ultraviolet light having a main wavelength of 365 nm output for a total of 2 J/cm$^2$. As such, regions of the organic EL layer 105 corresponding to areas where the optical barrier layer 108 is not formed (i.e., regions corresponding to the contact holes and to the inter-pixel areas) are subject to ultraviolet irradiation. Given that the electrical resistance of the areas subject to ultraviolet irradiation have higher electrical resistance, the non-light-emitting region 105a is formed in the organic EL layer 105 as shown in FIG. 6B. In addition, the ultraviolet light passing through the common electrode 106 and the ultraviolet light reflected by the pixel electrodes 104 serves to effectively increase the electrical resistance of the regions corresponding to the contact holes and to the inter-pixel areas in the organic EL layer 105. After ultraviolet irradiation, the optical barrier layer 108 may be removed.

In the manufacturing method for the organic EL display panel of the present Embodiment, the non-light-emitting region 105a is formed in the organic EL layer by performing the irradiation process after the formation of the intermediate layer 107 and the optical barrier layer 108. However, irradiation may also be selectively performed using a photo-mask at some point during the organic EL layer 105 assembly, so as to fat in the non-light-emitting region 105a without forming the optical barrier layer 108. However, in such a case, manufacturing costs increase due to the use of the photo-mask. When the irradiation process is performed during the formation of the organic EL layer 105, impurities and so on produced due to the light may remain within the organic EL layer and lead to a dramatic decrease in device functionality. As such, performing the irradiation process after the formation of the intermediate layer 107 and the optical barrier layer 108 is beneficial given the considerations of manufacturing simplicity and preventing a decrease in light-emitting component functionality.

Also, given that the non-light-emitting region 105a of the organic EL layer 105 achieves the functions of a bank, there is no need to provide separate bank portions. Typically, bank formation involves a bank material layer formation process, an optical exposure process using a photo-mask, a removal process of removing excess bank formation material, a baking process of baking the bank material to solidity, and so on. These processes impose a great load on manufacturing. In addition, the need for a photo-mask in forming the banks adds greatly to the associated costs.

Bank formation is not required in the manufacturing method for the organic EL display panel of the present Embodiment, thereby reducing the costs and simplifying manufacture.

Experiment 1

—Experimental Overview—

An experimental device was manufactured in order to evaluate the voltage vs. current density properties and the voltage vs. luminance properties of the light-emitting region and the non-light-emitting region of the organic EL layer by measuring these properties before and after ultraviolet irradiation.

—Experimental Device—

Figure 7:
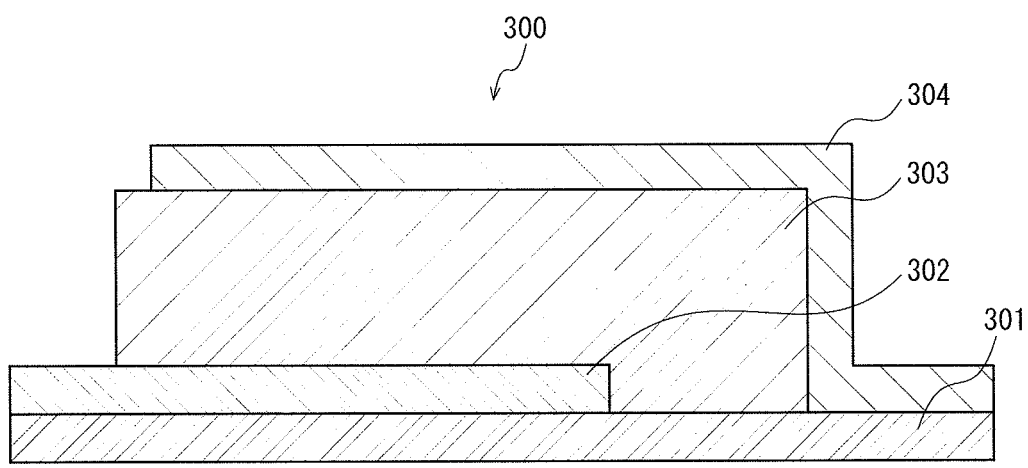
FIG. 7 is a schematic cross-sectional diagram of an experimental device 300.

FIG. 7 is a schematic cross-sectional diagram of an experimental device 300. As shown, the experimental device 300 includes a glass substrate 301 having a pixel electrode 302, an organic EL layer 303, and a common electrode 304 formed thereon. The basic construction of the experimental device 300 is as follows. Firstly, alkali free glass from Matsunami Glass Ind. was used as the glass substrate 301. Then, a sputtering method was used to form a layer of electrode material for the pixel electrode 302 over the glass substrate 301. The material for the pixel electrode 302 was an alloy of silver, palladium, and bronze, at a thickness of 50 nm.

A layer of resist material was subsequently formed over the layer of electrode material, using a spin coat method. A mask having apertures of a predetermined shape was then placed over the layer of resist material, and the top of the mask was exposed to light. Then, after washing away the excess resist material using an alkali developing fluid, a post-baking process was performed at 100° C. Next, after using a solution combining phosphoric acid, nitric acid, and acetic acid as an etching liquid to perform etching on the layer of electrode material, any remaining resist material was peeled off using a peeling solution.

A hole injection layer, a hole transport layer, an organic light-emitting layer, and an electron injection layer were then formed in the stated order, thereby completing the organic EL layer 303. The hole injection layer was formed using HAT-CN at a thickness of 10 nm, the hole transport layer was formed using NPD at a thickness of 60 nm, the organic light-emitting layer was made from Alq at a thickness of 50 nm, and the electron injection layer was made from Alq doped with 10% barium at a thickness of 20 nm.

The common electrode 304 was then formed over the organic EL layer 303 using a sputtering method and a metal mask. Indium-tin oxide was used for the common electrode 304, at a thickness of 200 nm.

Afterward, the experimental device 300 was irradiated from the top using ultraviolet light having a main wavelength of 365 nm for a total of 660 mJ/cm$^2$.

—Experiment Results—

Figure 8A:
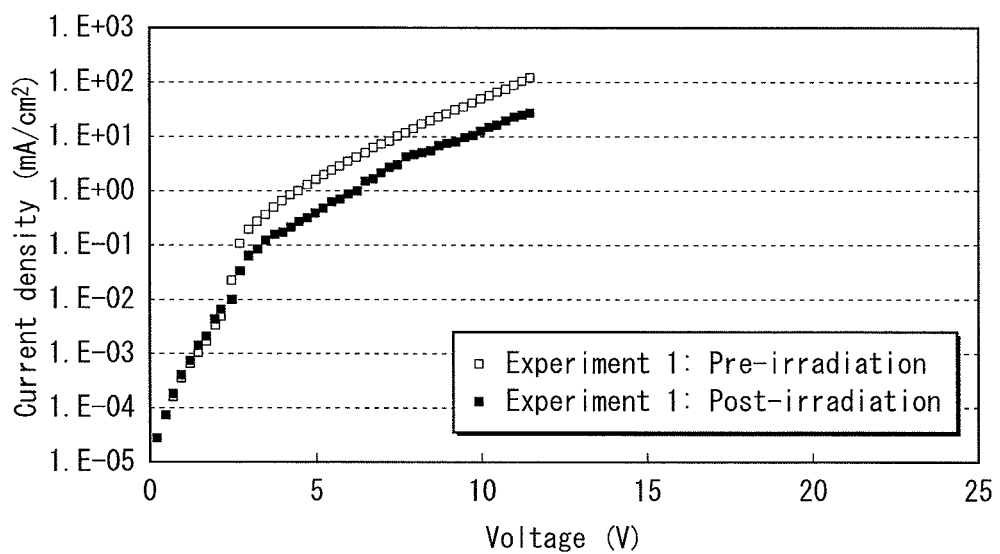
FIGS. 8A and 8B are experimental graphs, respectively showing current density and luminance varying according to voltage, before and after irradiation.
Figure 8B:
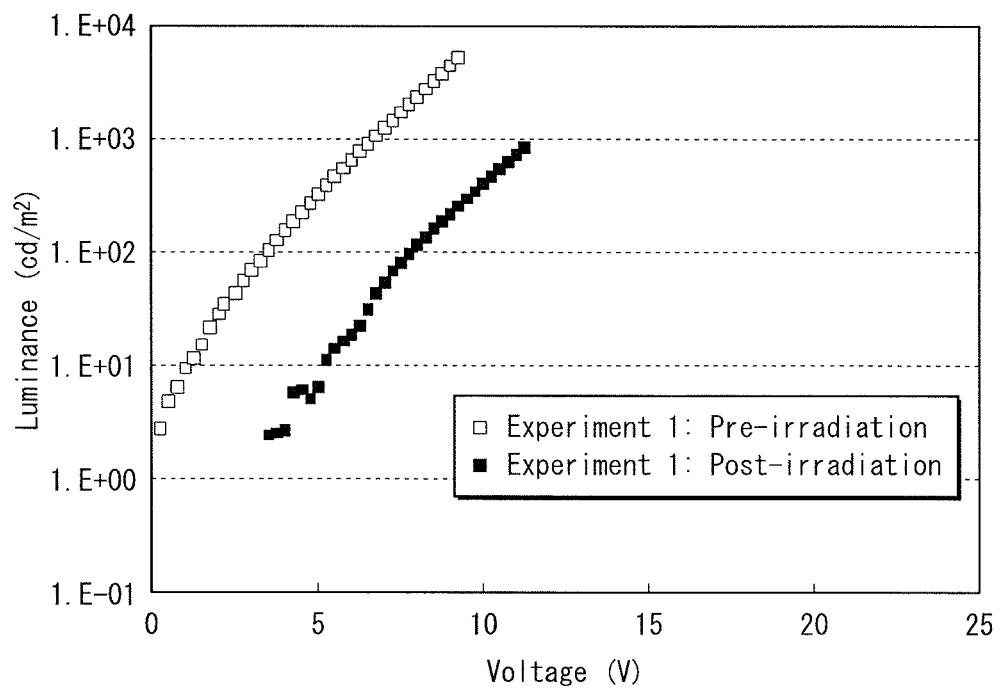

FIG. 8A is a graph of current density varying according to voltage before and after irradiation. The horizontal axis gives the voltage (in V), and the vertical axis gives the current density (in mA/cm$^2$). FIG. 8B is a graph of luminance varying according to voltage before and after irradiation. The horizontal axis gives the voltage (in V), and the vertical axis gives the luminance (in cd/m$^2$). In FIGS. 8A and 8B, the white squares (i.e., outlined shapes) indicate values before irradiation and the black squares (i.e., filled-in shapes) indicate values after irradiation.

As shown in FIG. 8A, the post-irradiation current density begins to fall below the pre-irradiation current density once the voltage is greater than approximately 2.8 V. In other words, the electrical resistance is greater after irradiation, relative to pre-irradiation conditions. Also, as shown in FIG. 8B, the post-irradiation luminance is lower than the pre-irradiation luminance.

According to the experimental results, irradiating the organic EL layer with ultraviolet light enables the electrical resistance to be increased relative to pre-irradiation conditions. This has the effect of decreasing the luminance.

—Organic EL Layer Electrical Resistance Increasing Mechanism—

The following describes the mechanism by which the electrical resistance of the organic EL layer is increased. When light (ranging from visible light to ultraviolet light) is incident upon a molecule M in the organic EL layer, that molecule enters an excited state. The molecule M subsequently returns from the excited state to the ground state, such that the majority of such molecules M return to the ground state. Given that the excited state is extremely reactive, the following chemical reactions are likely to occur.

1. The molecule M reacts with another, identical molecule M to produce a new compound differing from the molecule M.
2. The molecule M bonds with an impurity present in the organic EL layer.
3. Breakage occurs among the π electrons in the conjugated system of the molecule M.

As such, a subset of the molecules M are changed rather than returned to their original state. Typically, such a molecular change implies that the original properties are no longer exhibited. As such, the electrical resistance is increased. Thus, the effect of increasing the electrical resistance is that the luminance is decreased.

Although the organic EL display panel pertaining to the disclosure has been described according to the Embodiment, no particular limitation is intended thereto.

(Variation 1)

Figure 9:
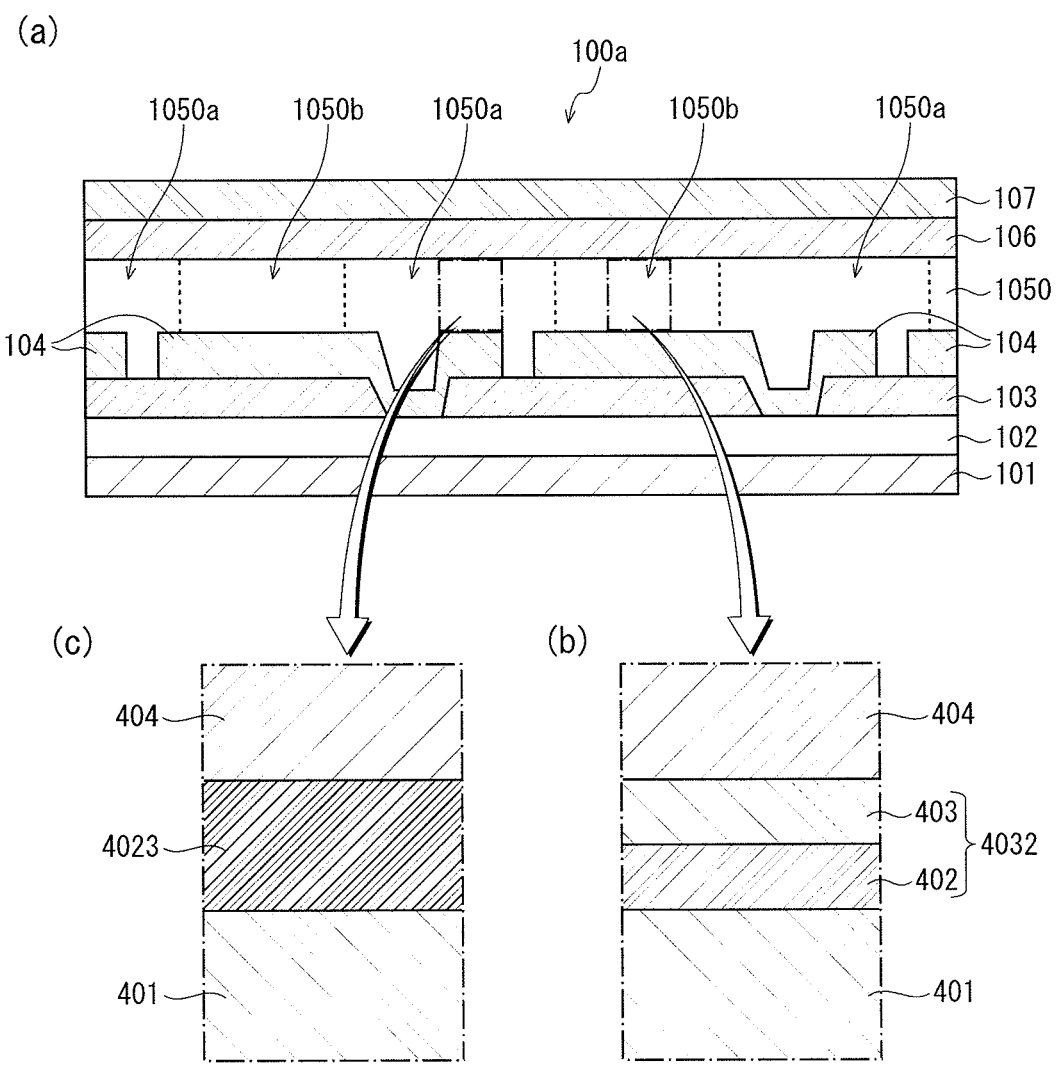
FIG. 9 is a schematic diagram of an organic electroluminescence display panel 100a pertaining to Variation 1, where portion (a) is a partial cross-section, portion (b) shows a light-emitting region 1050b of a organic electroluminescence layer 1050, and portion (c) shows a non-light-emitting region 1050a of the organic electroluminescence layer 1050.

A variation of the organic EL layer configuration is described below. Portion (a) of FIG. 9 is a schematic partial cross-section of an organic EL display panel 100*a* pertaining to Variation 1. Portion (b) of FIG. 9 is a schematic representation of a light-emitting region 1050*b* of the organic EL layer 1050. Portion (c) of FIG. 9 is a schematic representation of a non-light-emitting region 1050*a* of the organic EL layer 1050.

The organic EL display panel 100*a* is configured similarly to the organic EL display panel 100 shown in FIG. 2 with the exception of the organic EL layer 1050. Accordingly, explanations are omitted for components configured identically to those of organic EL display panel 100. The following centres on the points of difference.

As shown in portions (b) and (c) of FIG. 9, the organic EL layer 1050 of the organic EL display panel 100*a* includes a first organic light-emitting layer 401 and a second organic light-emitting layer 404 arranged with some separation from the first organic light-emitting layer 401 in the stack direction. The light-emitting region 1050*b* also includes a charge generation layer 4032 disposed between the first organic light-emitting layer 401 and the second organic light-emitting layer 404.

The charge generation layer 4032 includes an electron injection layer 402 and a hole injection layer 403.

The material for the electron injection layer may be an alkali metal or an alkali earth metal. Specific examples include lithium, sodium, potassium, rubidium, caesium, magnesium, calcium, and barium. Alternatively, a compound of an organic semiconductor with an n-dopant having electron transport properties is beneficially used. Beneficially, the n-dopant may be one of the aforementioned alkali metals or alkali rare earth metals. Likewise, the organic semiconductor used for electron transport properties may be a coordination complex with aluminium and quinoline such as Alq, a phenanthroline derivative such as BCP, a silole derivative, a triphenylphosphine derivative, or similar.

The material for the hole injection layer may be a metal oxide. Specific examples include molybdenum oxide, vanadium oxide, tungsten oxide, indium-tin oxide, and so on. Alternatively, a compound of an organic semiconductor having hole transport properties and a p-dopant is beneficially used. The p-dopant may be F4-TCNQ, HAT-CN, molybdenum oxide, vanadium oxide, tungsten oxide, and so on. The organic semiconductor having hole transport properties may be a triarylamine derivative.

In contrast, the non-light-emitting region 1050*a* includes a mixed layer 4023 between the first organic light-emitting layer 401 and the second organic light-emitting layer 404, instead of the charge generation layer 4032.

The mixed layer 4023 includes material from the electron injection layer and material from the hole injection layer. The mixed layer 4023 is formed through irradiation in an irradiation process. The details of the formation mechanism for the mixed layer 4023 are as follows. First, energy obtained through stimulation by an outside light causes transfer of material between the electron injection layer and the hole injection layer material. When material transfer occurs such that the material from the electron injection layer and the material from the hole injection layer combine, the material having electron-taking properties and the material having electron-giving properties begin to interact on an electron level. Once this occurs, the charge generation layer is unable to function and produces a high-electrical resistance layer in which little charge generation occurs. Accordingly, the electrical conductivity of the irradiated portions is greatly diminished.

The electron injection layer and the hole injection layer of the charge generation layer need not necessarily be disposed as neighbours. Another layer may be disposed therebetween, provided that the charge generation layer function of the whole is preserved. However, the thickness of such an intermediate layer must be such that the materials in each portion of the charge generation layer are not prevented from combining upon irradiation.

Also, when necessary, a hole injection layer, a hole transport layer, or a hole injection and transport layer may be disposed between the pixel electrodes 104 and the first organic light-emitting layer 401. Similarly, when necessary, an electron injection layer, an electron transport layer, or an electron injection and transport layer may be disposed between the common electrode 106 and the second organic light-emitting layer 404.

Experiment 2

—Experimental Overview—

An experimental device was manufactured in order to evaluate the voltage-current density properties and the voltage-luminance properties of the light-emitting region and the non-light-emitting region of the organic EL layer by measuring these properties before and after ultraviolet irradiation.

—Experimental Device—

The experimental device is basically configured similarly to experimental device 300 of FIG. 4. However, the organic EL layer configuration differs. Here, the organic EL layer includes a first hole injection layer, a first hole transport layer, a first light-emitting layer, an electron injection layer in the charge generation layer, a hole injection layer in the charge generation layer, a second hole transport layer, a second light-emitting layer, and an electron injection layer, each layered in the stated order. The first hole injection layer was formed using HAT-CN at a thickness of 10 nm. The first hole transport layer was formed using NPD at a thickness of 60 nm. The first organic light-emitting layer was made from Alq at a thickness of 40 nm. The electron injection layer in the charge generation layer was made from Alq doped with 10% barium at a thickness of 20 nm. The hole injection layer in the charge generation layer was formed using HAT-CN at a thickness of 20 nm. The second hole transport layer was formed using NPD at a thickness of 60 nm. The second organic light-emitting layer was made from Alq at a thickness of 60 nm. The electron injection layer was made from Alq doped with 10% barium at a thickness of 20 nm.

Afterward, the experimental device was irradiated from the top using ultraviolet light having a main wavelength of 365 nm for a total of 600 mJ/cm$^2$.

The configuration of components other than the organic EL layer is identical to that of the experimental device 300, and explanations thereof are thus omitted.

—Experiment Results—

Figure 10A:
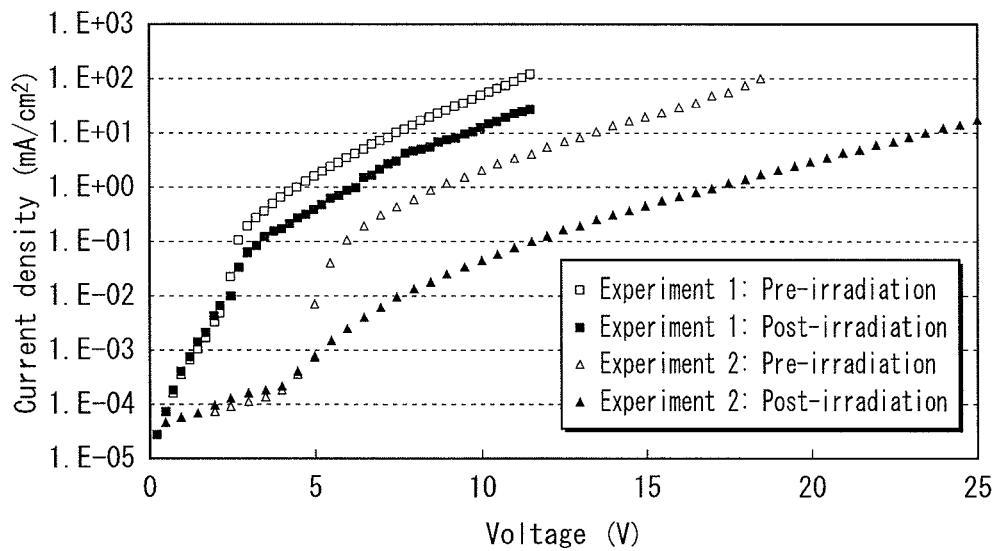
FIGS. 10A and 10B are experimental graphs, respectively showing current density and luminance varying according to voltage, before and after irradiation.
Figure 10B:
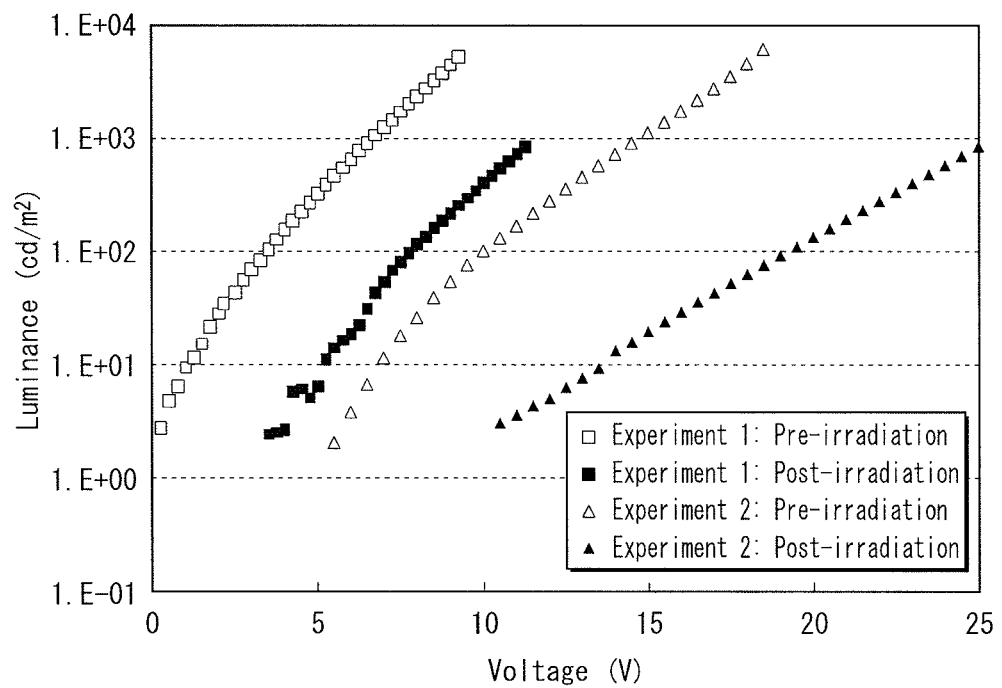

FIG. 10A is a graph of current density varying according to voltage before and after irradiation. For the sake of comparison, the voltage and current density before and after irradiation are presented jointly with those of FIG. 5A. The horizontal axis gives the voltage (in V), and the vertical axis gives the current density (in mA/cm$^2$). FIG. 10B is a graph of luminance varying according to voltage before and after irradiation. For the sake of comparison, the voltage and luminance before and after irradiation are presented jointly with those of FIG. 5B. The horizontal axis gives the voltage (in V), and the vertical axis gives the luminance (in cd/m$^2$). In FIGS. 10A and 10B, the white squares (i.e., outlined shapes) indicate values before irradiation for device 1, the black squares (i.e., filled-in shapes) indicate values after irradiation for device 1, the white triangles (i.e., outlined shapes) indicate values before irradiation for device 2, and the black triangles (i.e., filled-in shapes) indicate values after irradiation for device 2.

As shown in FIG. 10A, the post-irradiation current density of device 2 begins to fall below the pre-irradiation current density of the organic EL layer once the voltage is greater than approximately 5.0 V. In other words, the electrical resistance is greater after irradiation, relative to pre-irradiation conditions. Comparing the devices of experiments 1 and 2 reveals that the decrease in current density before and after irradiation is more intense in the device of experiment 2. That is, introducing the mixed layer between the first organic light-emitting layer and the second organic light-emitting layer provides a more intense decrease in current density.

The current density is greater in the device of experiment 1 than in the device of experiment 2, both before and after irradiation.

Also, as shown in FIG. 10B, the post-irradiation luminance of the organic EL layer is lower than the pre-irradiation luminance. Comparing the devices of experiments 1 and 2 reveals that the decrease in luminance before and after irradiation is more intense in the device of experiment 2. That is, introducing the mixed layer between the first organic light-emitting layer and the second organic light-emitting layer provides a more intense decrease in luminance.

The luminance is greater in the device of experiment 1 than in the device of experiment 2, both before and after irradiation.

According to these results, the device of experiment 1 is better than the device of experiment 2 in terms of electrical resistance in the light-emitting region, but not as good as the device of experiment 2 in terms of constraining light emission in the non-light-emitting region.

(Variation 2)

The following describes a Variation on a portion of the manufacturing method for the organic EL display panel.

The irradiation process has been described as occurring after the formation of the optical barrier layer 108. However, reactive ion etching may also be performed on the intermediate layer 107 prior to the irradiation process, using the optical barrier layer 108 as a resist. In such a case, the subsequent irradiation process may be performed using ultraviolet light having a main wavelength of 365 nm for a total of 500 mJ/cm$^2$. The silicon nitride used in the intermediate layer 107 absorbs a small amount of light at 365 nm. As such, performing etching on the intermediate layer 107 enhances the constraint of light emission in the non-light-emitting region. The optical barrier layer 108 is used twice, namely in the etching process of the intermediate layer 107 and in the irradiation process. As such, this approach constrains the increase in processes.

When etching is performed on the intermediate layer 107, the common electrode 106 is beneficially thickened in advance due to the possibility that etching may reach the common electrode 106 under the intermediate layer 107. For example, the thickness of the common electrode 106 is beneficially 10 nm or greater.

Also, the optical barrier layer 108 and the common electrode 106 may be made from the same material. When the optical barrier layer 108 and the common electrode 106 are both made of indium-tin oxide, and an ultraviolet laser is used for the irradiation process, the thickness of the optical barrier layer 108 is beneficially greater than the thickness of the common electrode 106. This approach increases the opacity of the optical barrier layer 108 and constrains the defects in the light-emitting region, thereby promoting degradation in the non-light-emitting region.

(Variation 3)

Figure 11:
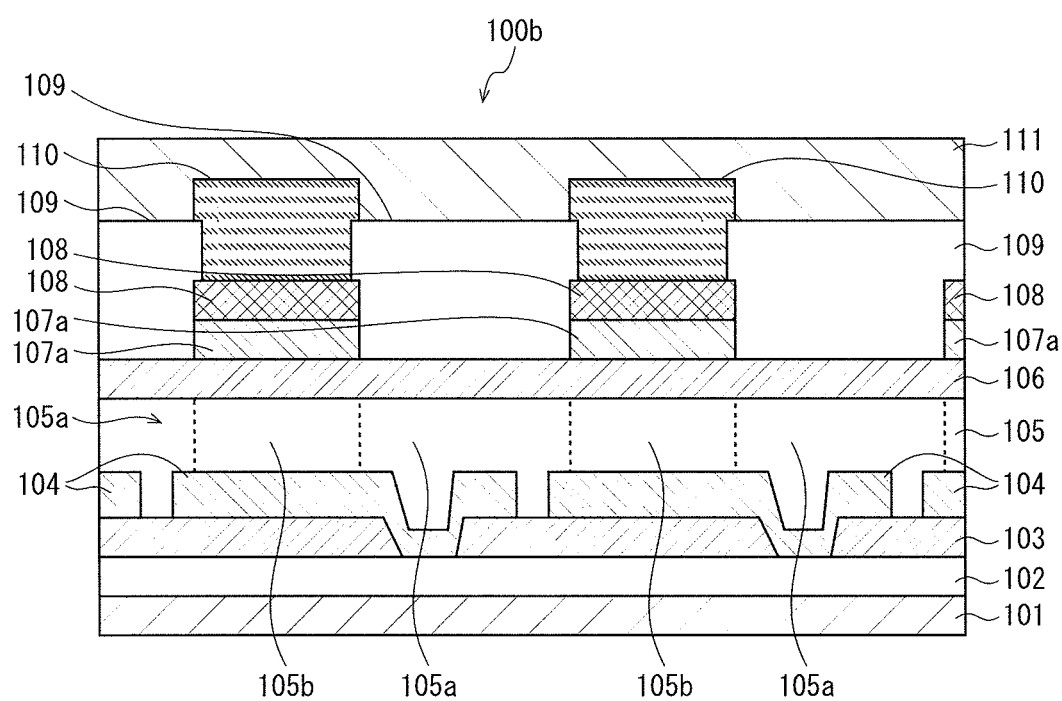
FIG. 11 is a schematic partial cross-section of an organic electroluminescence display panel 100b pertaining to Variation 3.

The following describes a variation in which a metal layer is provided to serve as an auxiliary electrode. FIG. 11 is a schematic partial cross-section of an organic EL display panel 100b pertaining to Variation 3. Organic EL display panel 100b is configured similarly to organic EL display panel 100 from the substrate 101 to the common electrode 106. Explanations of these components are thus omitted.

As shown in FIG. 11, a metal layer 109 is formed over the common electrode 106 in a region corresponding to the non-light-emitting region 105a. Accordingly, the common electrode 106 and the metal layer 109 are electrically connected. A protective layer 111 is also formed so as to cover the metal layer 109 and a colour filter 110.

Also, an intermediate layer 107a is subject to patterning (i.e., has apertures) and formed over the area of the common electrode 106 corresponding to the light-emitting region 105b. The optical barrier layer 108 is formed over the intermediate layer 107a. The colour filter 110 is formed over the optical barrier layer 108 and varies in colour across pixels.

The metal layer 109 is, for example, made of silver, aluminium, titanium, chromium, molybdenum, tungsten, or an alloy including any of the above. There is a risk that water, oxygen, and the like may entire through the apertures of the intermediate layer 107 and cause defects in the organic EL layer during the time from the etching process performed on the intermediate layer 107 to the metal layer formation process. Accordingly, the etching of the intermediate layer 107 is beneficially performed in vacuum, as a dry etching process. More beneficially still, transit is also performed in a vacuum, or is preformed in a nitrous environment, from the end of the etching process to the metal layer formation process, and the metal layer is formed using a sputtering method or vapour deposition method in the vacuum. Accordingly, there is no exposure to atmosphere nor any wet application process, thus constraining any deterioration of organic EL layer properties.

Also, the metal layer 109 may have a reflective index of no more than 30%, with respect to visible light incident on the top face thereof. Accordingly, the metal layer 109 also functions as a black matrix. Thus, light from the regions of the organic EL layer corresponding to the contact holes and to the inter-pixel regions is blocked. In addition, the metal layer 109 absorbs outside light, and improves the photo-contrast.

Processes following the formation of the metal layer, specifically forming a photo-resist for patterning the metal layer, exposure, developing, etching, and so on, do not present a problem of defects in the organic EL layer as the material used for the metal layer is sufficiently capable of acting as a gas barrier.

The colour filter 110 may use typical resist materials for colour filters.

The protective layer 111 serves to protect the organic EL display panel against mechanical shocks. The material for the protective layer 111 is required to be transparent and effective as hard coating. For example, an acrylic polymer material is beneficial.

According to this configuration, enhanced luminance is made possible by the metal layer 109 constraining the decrease in voltage in the common electrode 106.

—Manufacturing Method—

The method is as previously described until the formation of the intermediate layer 107. After forming the intermediate layer 107, etching is performed on the regions of the intermediate layer 107 corresponding to the contact holes and to the inter-pixel regions. Afterward, the substrate is transported to a sputter chamber without being exposed to the atmosphere, and the metal layer 109 is formed thereon. For example, when chromium is used for the metal layer 109, the layer may have a thickness of 300 nm. Subsequently, the surface may be oxidized through a plasma treatment in the presence of oxygen, in order to reduce the surface reflectivity of the metal layer 109.

Next, the colour filter 110 is formed by first forming a red colour resist using a spin coat method and pre-baking at 80° C., for example. After exposure and developing using a photo-mask suitable to rendering the appropriate red pixel pattern, a pure water rinse is performed followed by baking at 80° C. Next, the same process is performed with respective green and blue colour resists, such that green pixel and blue pixel patterning is performed to realise the completed colour filter.

Finally, the protective layer 111 is formed using a slit coating method with a photosensitive epoxy resin, and hardened by irradiation with ultraviolet light having a main wavelength of 365 nm.

(Other Variations)

(1) The organic EL layer may be configured by layering a first hole injection layer, a first hole transport layer, a first light-emitting layer, a first electron transport layer, a charge generation layer, a second hole transport layer, a second light-emitting layer, and a second electron transport layer, in the stated order. For the first hole injection layer, HAT-CN may be used at a thickness of 20 nm. For the first hole transport layer, NPD may be used at a thickness of 60 nm. For the first light-emitting layer, TBADN doped with 2% TBP may be used, at a thickness of 40 nm. For the first electron transport layer, Alq may be used at a thickness of 10 nm. For the electron injection layer in the charge generation layer, Alq doped with 10% barium may be used, at a thickness of 30 nm. For the hole injection layer in the charge generation layer, HAT-CN may be used at a thickness of 40 nm. For the second hole transport layer, NPD may be used at a thickness of 60 nm. For the second light-emitting layer, CBP doped with 10% Ir(phq)3 may be used, at a thickness of 60 nm. For the second electron transport layer, Alq doped with 10% barium may be used at a thickness of 10 nm.

(2) The intermediate layer 107 serves as a protective layer protecting the common electrode 106, and may additionally serve to protect the organic EL layer 105 against defects.

(3) Although the above describes an irradiation process using ultraviolet light, light having a main wavelength greater then 630 nm may also be used, such as infra-red light or an infra-red laser. In such a case, the material for the optical barrier layer 108 is beneficially a conductive oxide such as indium-tin oxide, or a conductive polymer such as PEDOT. Here, the thickness of the optical barrier layer may be any thickness enabling sufficient absorption of the light having a main wavelength greater than 630 nm, such as 10 nm to 100 μm, and is beneficially 100 nm to 10 μm. The following describes the mechanism by which the electrical resistance of the organic EL layer is increased when light having a main wavelength greater than 630 nm is used. When light (i.e., red or infra-red light) is incident on the molecules within the organic EL layer, these molecules enter a thermally excited state. The molecules in the thermally excited state have higher kinetic energy, and thus exhibit a degree of motion within the layer. Typically, the organic EL layer has a multi-layer configuration. Thus, the motion of the molecules produces a mixed layer as the molecules mix across layer boundaries. The mixed layer typically has lower electrical conductivity and less mobility. Thus, the effect of increasing the electrical resistance is that the luminance is decreased. Specifically, when layers having different properties (e.g., the hole injection layer and the electron injection layer) are in contact, molecules combining from each layers can produce high resistance.

(4) The charge generation layer 4032 is described as including two layers, but may also be configured from three or more layers.

(5) An adhesive layer may be provided instead of the protective layer 111, and opposing substrates may be joined through the adhesive layer. The material for the adhesive layer is, for example, a photosensitive epoxy resin, applied using a dispenser. The opposing substrate is, for example, made of non-alkali glass and has a thickness of 0.3 mm.

INDUSTRIAL APPLICABILITY

The present invention is widely applicable to organic EL display panels.

REFERENCE SIGNS LIST

101 Substrate
102 TFT layer
103 Inter-layer insulation film
104 Pixel electrode
105 Organic electroluminescence layer
105a Non-light-emitting region
105b Light-emitting region
106 Common electrode
107 Intermediate layer
108 Optical barrier layer
109 Metal layer
110 Colour filter
111 Protective layer

The invention claimed is:

1. An organic electroluminescence display panel, comprising:
   a transistor array substrate on which a plurality of drivers is disposed, each including a thin-film transistor element;
   an inter-layer insulation film formed over the transistor array substrate, and having a plurality of contact holes each formed in part of respective regions of the inter-layer insulation film corresponding to the drivers;
   a plurality of pixel electrodes disposed on the inter-layer insulation film in correspondence with the drivers, and electrically connected to the drivers via the contact holes;
   an organic electroluminescence layer formed to entirely cover portions of the inter-layer insulation film where the pixel electrodes are disposed and where the pixel electrodes are not disposed; and
   a common electrode formed across the entirety of the organic electroluminescence layer, wherein
   regions of the organic electroluminescence layer corresponding to the contact holes in the inter-layer insulation film and to an area between neighbouring pixel electrodes have higher electrical resistance than an other region of the organic electroluminescence layer,
   the organic electroluminescence layer includes a first organic light-emitting layer and a second organic-light emitting layer arranged with separation from the first organic light-emitting layer with respect to a layering direction,
   a charge generation layer is located in the other region of the organic electroluminescence layer, and includes at least two sub-layers between the first organic light-emitting layer and the second organic light-emitting layer, and
   a mixed layer, in which material from each of the at least two sub-layers is combined, between the first organic light-emitting layer and the second organic light-emitting layer in the regions corresponding to the contact holes in the inter-layer insulation film and to the area between the neighbouring pixel electrodes.

2. The organic electroluminescence display panel of claim 1, wherein
   a metal layer is formed over the common electrode, in the regions corresponding to the contact holes in the inter-layer insulation film and to the area between the neighbouring pixel electrodes.

3. The organic electroluminescence display panel of claim 2, wherein
   a top face of the metal layer has a reflective index of no more than 30% with respect to visible light.

4. The organic electroluminescence display panel of claim 2, wherein
   the metal layer is an auxiliary electrode, and is electrically connected to the common electrode.

5. The organic electroluminescence display panel of claim 1, wherein
   the organic electroluminescence layer includes an organic light-emitting layer producing that produces white light.

6. The organic electroluminescence display panel of claim 1, wherein
   a colour filter corresponding to each of the pixel electrodes is formed over the common electrode.

7. The organic electroluminescence display panel of claim 1, wherein
   the pixel electrodes are formed of an optically reflective material, and
   the common electrode is formed of an optically transmissive material.

8. An organic electroluminescence display panel manufacturing method, comprising:
   preparing a substrate;
   forming a transistor array substrate by disposing a plurality of drive units drivers, each including a thin-film transistor element, on the substrate;
   forming an inter-layer insulation film having a plurality of contact holes, each formed in part of respective regions corresponding to the drivers, over the transistor array substrate;
   disposing a plurality of pixel electrodes on the inter-layer insulation film in correspondence with the drivers, the pixel electrodes being electrically connected to the drivers via the contact holes;
   forming an organic electroluminescence layer to entirely cover portions of the inter-layer insulation film where the pixel electrodes are disposed and where the pixel electrodes are not disposed, regions of the organic electroluminescence layer corresponding to the contact holes in the inter-layer insulation film and to an area between neighbouring pixel electrodes having higher electrical resistance than an other region of the organic electroluminescence layer;
   forming a common electrode across the entirety of the organic electroluminescence layer;
   forming an intermediate layer over the common electrode in order to protect the common electrode;
   forming an optical barrier layer on a region of the intermediate layer excluding regions corresponding to the contact holes in the inter-layer insulation film and to the area between neighbouring pixel electrodes;
   irradiating the organic electroluminescence layer with a predetermined laser light from above the optical barrier layer, such that the optical barrier layer serves as a resist, wherein
   the regions of the organic electroluminescence layer corresponding to the contact holes in the inter-layer insulation film and to the area between neighbouring pixel electrodes have the higher electrical resistance than the other region of the organic electroluminescence layer due to degradation upon irradiation with the predetermined laser light.

9. The organic electroluminescence display panel manufacturing method of claim 8, wherein
   the predetermined laser light has a wavelength of no more than 420 nm.

10. The organic electroluminescence display panel manufacturing method of claim 8, wherein
    the predetermined laser light includes ultra-violet light.

11. The organic electroluminescence display panel manufacturing method of claim 8, wherein
    the optical barrier layer absorbs light having a wavelength of 420 nm or less, while allowing light from the organic electroluminescence layer to pass therethrough.

12. The organic electroluminescence display panel manufacturing method of claim 8, further comprising:
    exposing regions of the common electrode corresponding to the contact holes in the inter-layer insulation film and to the area between neighbouring pixel electrodes after forming the optical barrier layer and before irradiation with the predetermined laser light, by removing a portion of the intermediate layer with the optical barrier layer serving as the resist, and
    forming a metal layer over the exposed regions of the common electrode.

13. The organic electroluminescence display panel manufacturing method of claim 12, wherein
a top face of the metal layer has a reflective index of no more than 30% with respect to visible light.

14. The organic electroluminescence display panel manufacturing method of claim 12, wherein
the metal layer is an auxiliary electrode, and is electrically connected to the common electrode.

15. The organic electroluminescence display panel manufacturing method of claim 8, wherein
the organic electroluminescence layer is formed by layering a first organic light-emitting layer, a charge generation layer that includes two or more sub-layers, and a second organic light-emitting layer, in order, and
regions of the charge generation layer corresponding to the contact holes in the inter-layer insulation film and to the area between neighbouring pixel electrodes have higher electrical resistance than another region of the charge generation layer due to the irradiation with the predetermined laser light.

16. The organic electroluminescence display panel manufacturing method of claim 8, wherein
the pixel electrodes are formed of an optically reflective material, and
the common electrode is formed of an optically transmissive material.

17. An organic electroluminescence display panel manufacturing method, comprising:
preparing a substrate;
forming a transistor array substrate by disposing a plurality of drivers, each including a thin-film transistor element, on the substrate;
forming an inter-layer insulation film having a plurality of contact holes, each formed in part of respective regions corresponding to the drivers, over the transistor array substrate;
disposing a plurality of pixel electrodes on the inter-layer insulation film in correspondence with the drivers, the pixel electrodes being electrically connected to the drivers via the contact holes;
forming an organic electroluminescence layer to entirely cover portions of the inter-layer insulation film where the pixel electrodes are disposed and where the pixel electrodes are not disposed; and
forming a common electrode across the entirety of the organic electroluminescence layer, wherein
regions of the organic electroluminescence layer corresponding to the contact holes in the inter-layer insulation film and to an area between neighbouring pixel electrodes have higher electrical resistance than another region of the organic electroluminescence layer,
the organic electroluminescence layer is formed by layering a first organic light-emitting layer, a charge generation layer that includes at least two sub-layers, and a second organic light-emitting layer, in order, and
regions of the charge generation layer corresponding to the contact holes in the inter-layer insulation film and to the area between neighbouring pixel electrodes have higher electrical resistance than another region of the charge generation layer due to irradiation with laser light.

\* \* \* \* \*